US012563944B2

(12) United States Patent
Wang et al.

(10) Patent No.: US 12,563,944 B2
(45) Date of Patent: Feb. 24, 2026

(54) OLED DISPLAY PANEL

(71) Applicants: Hefei BOE Joint Technology Co., Ltd., Anhui (CN); BOE TECHNOLOGY GROUP CO., LTD., Beijing (CN)

(72) Inventors: Xinxin Wang, Beijing (CN); Dacheng Zhang, Beijing (CN); Ning Liu, Beijing (CN); Yu Wang, Beijing (CN); Bin Zhou, Beijing (CN); Can Yuan, Beijing (CN)

(73) Assignees: Hefei BOE Joint Technology Co., LTD, Anhui (CN); BOE TECHNOLOGY GROUP CO., LTD, Beijing (CN)

( * ) Notice: Subject to any disclaimer, the term of this patent is extended or adjusted under 35 U.S.C. 154(b) by 495 days.

(21) Appl. No.: 18/005,676

(22) PCT Filed: Feb. 28, 2022

(86) PCT No.: PCT/CN2022/078234
§ 371 (c)(1),
(2) Date: Jan. 17, 2023

(87) PCT Pub. No.: WO2023/159554
PCT Pub. Date: Aug. 31, 2023

(65) Prior Publication Data
US 2024/0251636 A1     Jul. 25, 2024

(51) Int. Cl.
*H10K 59/80*     (2023.01)
*H10K 59/12*     (2023.01)
*H10K 59/124*     (2023.01)

(52) U.S. Cl.
CPC ... *H10K 59/80522* (2023.02); *H10K 59/1201* (2023.02); *H10K 59/124* (2023.02)

(58) Field of Classification Search
CPC ......... H10K 59/80522; H10K 59/1201; H10K 59/124; H10K 59/00; H10K 59/122; H10K 50/824
See application file for complete search history.

(56) References Cited

U.S. PATENT DOCUMENTS

2009/0224233 A1     9/2009    Obata et al.
2015/0034913 A1     2/2015    Yoon
(Continued)

FOREIGN PATENT DOCUMENTS

CN     101375428 B     12/2010
CN     103311265 A     9/2013
(Continued)

*Primary Examiner* — Chad M Dicke
*Assistant Examiner* — Gary Abel
(74) *Attorney, Agent, or Firm* — Myers Bigel, P.A.

(57) ABSTRACT

An OLED display panel includes a base substrate and an OLED device on the base substrate. The OLED device includes: an auxiliary electrode in the non-light-emitting region, the auxiliary electrode includes a conductive layer and a conductive column on a side of the conductive layer away from the base substrate, and an orthographic projection of the conductive column on the base substrate is within an orthographic projection of the conductive layer on the base substrate; and an insulating layer between the conductive layer and the base substrate; a groove is arranged on a surface of the insulating layer away from the base substrate, and an orthographic projection of the groove on the base substrate at least partially overlaps with the orthographic projection of the isolation structure on the base substrate.

19 Claims, 5 Drawing Sheets

(56) References Cited

U.S. PATENT DOCUMENTS

| | | | |
|---|---|---|---|
| 2017/0125495 A1 | 5/2017 | Lee et al. | |
| 2018/0190944 A1 | 7/2018 | Lee et al. | |
| 2021/0376283 A1* | 12/2021 | Shin | H10K 59/124 |
| 2022/0037616 A1* | 2/2022 | Liu | H10K 59/122 |

FOREIGN PATENT DOCUMENTS

| | | | | |
|---|---|---|---|---|
| CN | 106803547 A | | 6/2017 | |
| CN | 107785381 A | | 3/2018 | |
| CN | 106803544 B | | 11/2018 | |
| CN | 110911461 A | | 3/2020 | |
| CN | 108269943 B | | 6/2020 | |
| CN | 111668269 A | | 9/2020 | |
| CN | 114447075 A | * | 5/2022 | H10K 59/126 |
| JP | 2007108469 A | | 4/2007 | |
| JP | 2011071024 A | * | 4/2011 | H10K 50/814 |
| KR | 20180003965 A | * | 1/2018 | H01L 27/3211 |

* cited by examiner

OLED DISPLAY PANEL

CROSS REFERENCE TO RELATED APPLICATION

The present application is a 35 U.S.C. 371 national stage application of a PCT International Application No. PCT/CN2022/078234, filed on Feb. 28, 2022, the entire disclosure of which is incorporated herein by reference.

TECHNICAL FIELD

The present disclosure relates to the display technology, in particular an OLED display panel.

BACKGROUND

Compared with LCD display apparatuses, OLED (organic light-emitting diode) display apparatuses have the characteristics of self-illumination, high luminous efficiency, low operating voltage, light weight, flexibility and simple manufacturing process, and are widely used in display lighting and other fields. According to a position of the light-emitting surface, OLED devices include top emitting OLED devices and bottom emitting OLED devices. Top emitting OLED devices have been widely focused studied because of their high opening ratio.

SUMMARY

The inventors noticed that top emitting OLED devices require thin cathodes and emitting anodes to increase the light transmittance. However, a surface resistance of a thin transparent cathode is large, and the IR drop is particularly obvious at the position far away from the electrode. In large size OLED display apparatuses, the cathode and the auxiliary electrode of OLED devices are usually separated by organic materials and cannot be effectively electrically connected. This results in uneven brightness of the display apparatuses.

The disclosure provides an OLED display panel. According to embodiments of the present disclosure, a contact area between a second electrode (e.g., a cathode) and an auxiliary electrode of an OLED device is increased, the bonding effect is improved, the IR drop on the second electrode is effectively reduced, and the uneven brightness of the display apparatus is eliminated.

According to an aspect of the present disclosure, an OLED display panel is provided. The OLED display panel comprises a base substrate and an OLED device on the base substrate. The OLED device comprises a light-emitting region and a non-light-emitting region; the OLED device comprises: a first electrode in the light-emitting region; an auxiliary electrode in the non-light-emitting region, the auxiliary electrode comprises a conductive layer and a conductive column on a side of the conductive layer away from the base substrate, and an orthographic projection of the conductive column on the base substrate is within an orthographic projection of the conductive layer on the base substrate; an organic light-emitting layer on a side of the first electrode away from the base substrate; a second electrode on a side of the organic light-emitting layer away from the base substrate; an isolation structure on a side of the conductive column away from the substrate, and the orthographic projection of the conductive column on the base substrate is within an orthographic projection of the isolation structure on the base substrate; and an insulating layer between the conductive layer and the base substrate; a groove is arranged on a surface of the insulating layer away from the base substrate, and an orthographic projection of the groove on the base substrate at least partially overlaps with the orthographic projection of the isolation structure on the base substrate.

Optionally, in some embodiments, the second electrode contacts a part of a top surface of the conductive layer and a part of a side surface of the conductive column.

Optionally, in some embodiments, a distance of the orthographic projection of the isolation structure on the base substrate extending beyond the orthographic projection of the conductive column on the base substrate is a, a distance between an orthographic projection of an edge of the groove on the base substrate and the orthographic projection of the conductive column on the base substrate is z, and z is less than a.

Optionally, in some embodiments, a depth of the groove is greater than a thickness of the organic light-emitting layer.

Optionally, in some embodiments, a shape of the groove is a spherical crown, and a diameter of the groove is greater than a (that is, a distance of an orthographic projection of the isolation structure on the substrate extending beyond an orthographic projection of the conductive column on the base substrate).

Optionally, in some embodiments, the diameter of the groove is greater than z (that is, a distance between an orthographic projection of an edge of the groove on the base substrate and the orthographic projection of the conductive column on the base substrate).

Optionally, in some embodiments, a shape of the groove is selected from any one of a cuboid, a spherical crown, and a connected shape of at least two spherical crowns.

Optionally, in some embodiments, a bottom surface of the isolation structure is in direct contact with a top surface of the conductive column; a material of the isolation structure comprises one of indium tin oxide and indium zinc oxide; a material of the conductive column comprises at least one of aluminum, copper, molybdenum and gold.

Optionally, in some embodiments, a material of the insulating layer is resin.

Optionally, in some embodiments, a material of the conductive layer comprises one of indium tin oxide and indium zinc oxide; a material of the second electrode comprises one of indium tin oxide and indium zinc oxide.

Optionally, in some embodiments, the conductive layer comprises a through hole, and a part of the conductive column fills the through hole.

Optionally, in some embodiments, a bottom surface of the conductive column is in direct contact with a top surface of the conductive layer.

Optionally, in some embodiments, the first electrode is connected to a thin film transistor through a via hole in the insulating layer, and a width of the groove is less than a width of the via hole in the insulating layer.

Optionally, in some embodiments, a slope angle of the groove is less than a slope angle of the via hole in the insulating layer.

Optionally, in some embodiments, the OLED display panel further comprises a pixel definition layer; an edge of the pixel definition layer extends to the groove.

Optionally, in some embodiments, a slope angle of the groove is less than a slope angle of the edge of the pixel definition layer.

Optionally, in some embodiments, a bottom vertex of the groove and the isolation structure do not overlap in the direction perpendicular to the base substrate.

Optionally, in some embodiments, the OLED display panel further comprises a gate layer and a source drain layer; wherein at least one of the gate layer and the source drain layer has a concave structure at a position corresponding to the groove.

Optionally, in some embodiments, the OLED display panel further comprises an interlayer dielectric layer; wherein the interlayer dielectric layer is provided with a concave structure at a position corresponding to the groove.

Optionally, in some embodiments, a source electrode and a drain electrode of the thin film transistor are connected with an active layer of the thin film transistor through a via hole in the interlayer dielectric layer, and a size of the via hole in the interlayer dielectric layer is larger than a size of the via hole in the insulating layer.

BRIEF DESCRIPTION OF THE DRAWINGS

In order to more clearly illustrate the technical solutions in embodiments of the disclosure or in the prior art, the appended drawings needed to be used in the description of the embodiments or the prior art will be introduced briefly in the following. Obviously, the drawings in the following description are only some embodiments of the disclosure, and for those of ordinary skills in the art, other drawings may be obtained according to these drawings under the premise of not paying out creative work.

DETAILED DESCRIPTION OF THE DISCLOSURE

In the following, the technical solutions in the embodiments of the disclosure will be described clearly and completely in connection with the drawings in the embodiments of the disclosure. Obviously, the described embodiments are only part of the embodiments of the disclosure, and not all of the embodiments. Based on the embodiments in the disclosure, all other embodiments obtained by those of ordinary skills in the art under the premise of not paying out creative work pertain to the protection scope of the disclosure.

Figure 1:
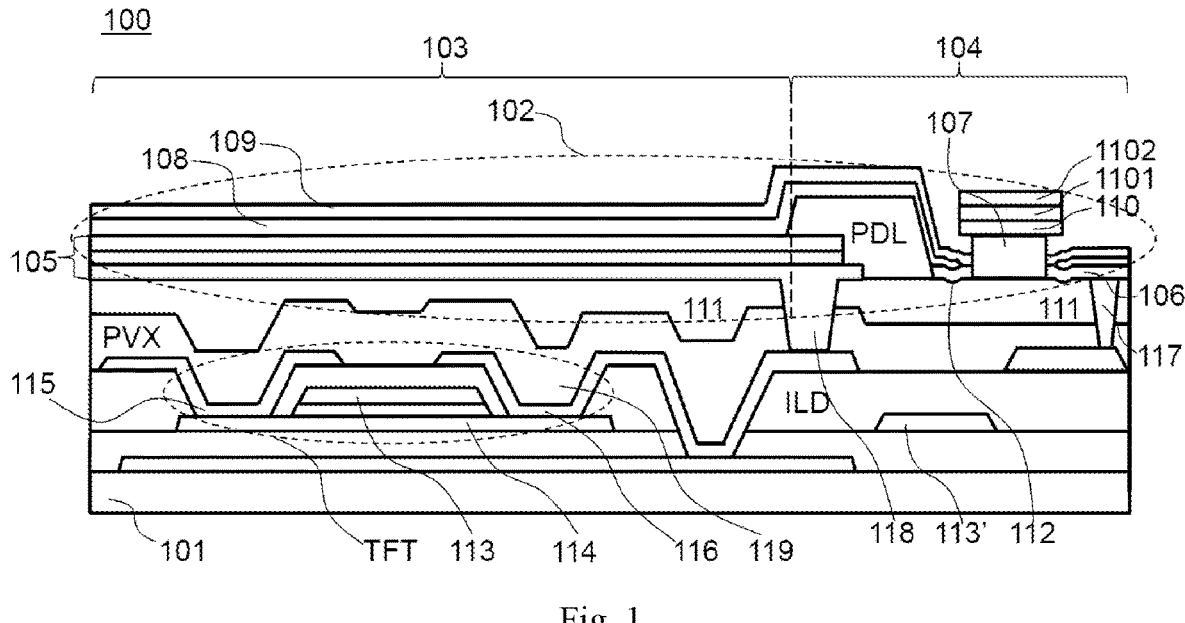
FIG. 1 is a schematic diagram of an OLED display panel according to an embodiment of the present disclosure.

According to an aspect of the present disclosure, an OLED display panel is provided. FIG. 1 is a schematic diagram of an OLED display panel according to an embodiment of the present disclosure. The OLED display panel 100 comprises: a base substrate 101 and an OLED device 102 on the base substrate 101; wherein the OLED device 102 comprises a light-emitting region 103 and a non-light-emitting region 104; the OLED device 102 comprises: a first electrode 105 in the light-emitting region 103; an auxiliary electrode in the non-light-emitting region 104, the auxiliary electrode comprises a conductive layer 106 and a conductive column 107 on a side of the conductive layer 106 away from the base substrate 101, and an orthographic projection of the conductive column 107 on the base substrate 101 is within an orthographic projection of the conductive layer 106 on the base substrate 101; an organic light-emitting layer 108 on a side of the first electrode 105 away from the base substrate 101; a second electrode 109 on a side of the organic light-emitting layer 108 away from the base substrate 101; an isolation structure 110 on a side of the conductive column 107 away from the substrate 101, and the orthographic projection of the conductive column 107 on the base substrate 101 is within an orthographic projection of the isolation structure 110 on the base substrate 101; and an insulating layer 111 between the conductive layer 106 and the base substrate 101; a groove 112 is arranged on a surface of the insulating layer 111 away from the base substrate 101, and an orthographic projection of the groove 112 on the base substrate 101 at least partially overlaps with the orthographic projection of the isolation structure 110 on the base substrate 101.

Those skilled in the art can understand that an array composed of multiple OLED devices may be arranged on the OLED display panel, and multiple OLED devices may have the same structure.

As shown in FIG. 1, the OLED display panel 100 may comprise a thin film transistor TFT for driving the OLED device 102. The thin film transistor TFT may comprise a gate 113, an active layer 114, a source 115, and a drain 116. The OLED display panel 100 may further comprise an interlayer dielectric layer ILD and a passivation layer PVX. The pixel definition layer PDL may be arranged between the light-emitting region 103 and the non-light-emitting region 104 to define the light-emitting region 103. The auxiliary electrode may be connected to an external circuit via a conductor plug 117. The isolation structure 110 may comprise a conductive material. A layer of organic light-emitting material 1101 and a layer of second electrode material 1102 may be stacked on a top of the isolation structure 110 in turn.

In the embodiment of the present disclosure, since the orthographic projection of the conductive column 107 on the base substrate 101 is within the orthographic projection of the isolation structure 110 on the base substrate 101, when the organic light-emitting layer 108 is formed by using, for example, an evaporation process, the organic light-emitting material will be disconnected at the positon of the isolation structure 110. With the isolation structure 110, the part of the organic light-emitting layer 108 of the OLED device 102 extending to the non-light-emitting region 104 can be effectively "cut off", thereby avoiding the transverse leakage current of the organic light-emitting layer 108 at this position. By arranging a groove 112 on the surface of the insulating layer 111 away from the base substrate 101, the conductive layer 106 will also form a concave structure corresponding to the groove 112, and the shape of the concave structure matches the shape of the groove 112. When the organic light-emitting layer 108 is formed (e.g., by the evaporation process), the material of the organic light-emitting layer (i.e., the organic light-emitting material) will diffuse into the concave structure of the conductive layer 106. Therefore, when the second electrode 109 is formed (e.g., by the sputtering process), a material of the second electrode 109 can be filled to a side surface of the conductive column 107 and the top surface of the conductive layer 106 through the concave structure of the conductive layer 106, thereby enhancing the electrical connection between the second electrode 109 and the auxiliary electrode, and eliminating the uneven brightness of the display device.

Optionally, in some embodiments, the second electrode 109 contacts a part of the top surface of the conductive layer 106 and a part of the side surface of the conductive column 107.

Figure 2:
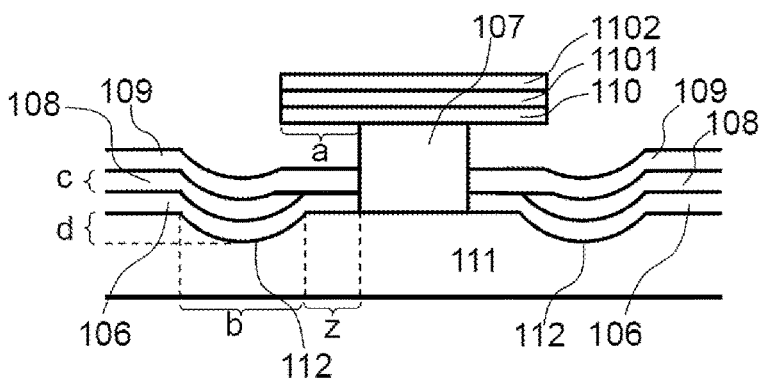
FIG. 2 is a partial schematic diagram of the OLED display panel shown in FIG. 1.
Figure 3:
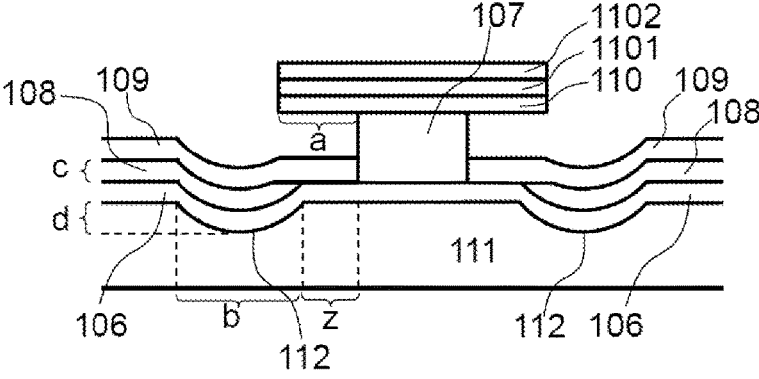
FIG. 3 shows an auxiliary electrode of an OLED display panel according to another embodiment of the present disclosure.

As shown in FIGS. 1 to 3, the second electrode 109 contacts a part of the top surface of the conductive layer 106 and a part of the side surface of the conductive column 107. Therefore, the contact area between the second electrode 109 and the auxiliary electrode of the OLED device is increased, the bonding effect is improved, and the IR drop on the second electrode 109 is effectively reduced, thereby further eliminating the uneven brightness of the display device.

Optionally, in some embodiments, as shown in FIGS. 2 and 3, a distance of a the orthographic projection of the isolation structure 110 on the base substrate 101 extending beyond the orthographic projection of the conductive column 107 on the base substrate 101 is in the range of 0.5 μm to 1.3 μm; a distance z between the orthographic projection of the edge of the groove 112 on the base substrate 101 and the orthographic projection of the conductive column 107 on the base substrate 101 is less than a, and the difference between a and z is 0.2 μm to 0.4 μm; a depth d of the groove 112 is in the range of 200 nm to 400 nm.

FIG. 2 is a partial schematic diagram of the OLED display panel shown in FIG. 1 at the non-light-emitting region 104. As described above, when the organic light-emitting layer 108 is formed (e.g., by the evaporation process), the material of the organic light-emitting layer diffuses into the concave structure of the conductive layer 106, and the organic light-emitting layer 108 extending below the isolation structure 110. A length of the organic light-emitting layer 108 extending below the isolation structure 110 is about 0.3 μm to 0.6 μm. The inventor finds that the difference between a and z significantly affects the electrical connection between the second electrode 109 and the auxiliary electrode.

In some comparison examples, when the value of a is in the range of 0.5 μm to 0.7 μm, the second electrode 109 only contacts the side wall of the conductive column 107 (not shown in the figure). In other comparison examples, when the value of a is in the range of 0.8 μm to 0.9 μm, the second electrode 109 contacts the side wall of the conductive column 107 and the top of the conductive layer 106. However, the contact area between the second electrode 109 and the side wall of the conductive column 107 and the top of the conductive layer 106 is small (not shown in the figure), resulting in large local resistance. In other comparison examples, when the value of a is in the range of 1.0 μm to 1.3 μm, the second electrode 109 only contacts the top of the conductive layer 106 (not shown in the figure).

With the above relationship, the material of the second electrode 109 can be filled to the side surface of the conductive column 107 and the top surface of the conductive layer 106 through the concave structure of the conductive layer 106, effectively increasing the contact area between the second electrode 109 and the side wall of the conductive column 107 and the top of the conductive layer 106.

Optionally, in some embodiments, as shown in FIGS. 2 and 3, the depth d of the groove 112 is greater than the thickness c of the organic light-emitting layer 108, and the difference between the depth d of the groove 112 and the thickness c of the organic light-emitting layer 108 is in the range of 100 nm to 300 nm.

With the above relationship, the depth d of the groove 112 can be determined based on the thickness c of the organic light-emitting layer 108, so as to more effectively enhance the electrical connection between the second electrode 109 and the auxiliary electrode.

Optionally, in some embodiments, as shown in FIGS. 1, 2 and 3, a shape of the groove 112 is a spherical crown, and a diameter b of the groove 112 is greater than a; a difference between the diameter b of the groove 112 and a is 0.5 μm to 1 μm. Optionally, the diameter b of the groove 112 is greater than z.

Figure 4A:
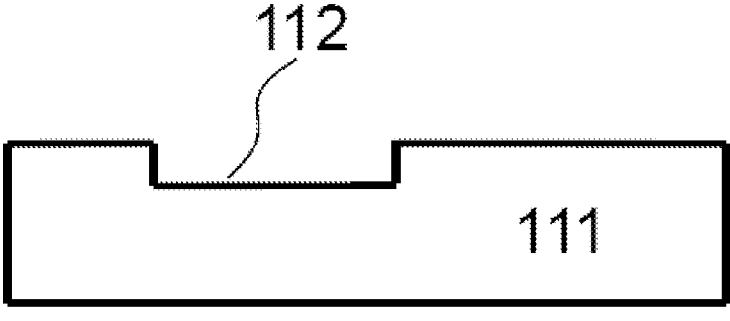
FIGS. 4a to 4c are schematic diagrams of grooves according to embodiments of the present disclosure.
Figure 4B:
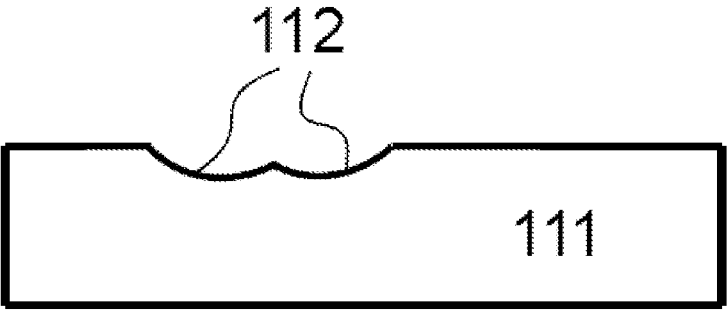
Figure 4C:
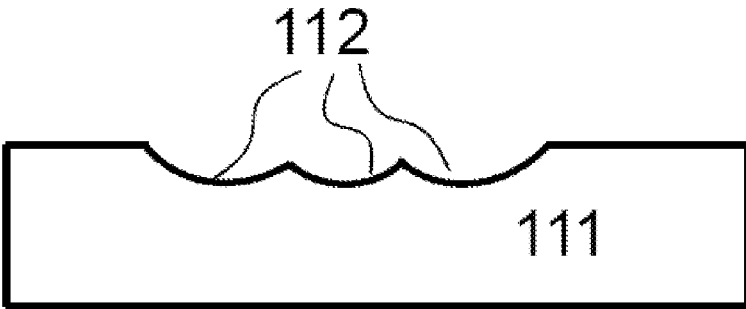

Optionally, in some embodiments, as shown in FIGS. 4a to 4c, a shape of the groove 112 is selected from any one of a cuboid, a spherical crown, and a connected shape of at least two spherical crowns.

The groove 112 may be a groove surrounding the auxiliary electrode, that is, a circular groove. Therefore, the orthographic projection of the groove 112 on the base substrate 101 may be a circle. Similarly, the groove 112 may also be a semicircle between the light-emitting region 103 and the auxiliary electrode. In alternative embodiments, a plurality of grooves 112 may be arranged between the light-emitting region 103 and the auxiliary electrode.

Optionally, in some embodiments, as shown in FIGS. 1 to 3, the bottom surface of the isolation structure 110 is in direct contact with the top surface of the conductive column 107; a material of the isolation structure 110 comprises one of indium tin oxide and indium zinc oxide; a material of the conductive column 107 comprises at least one of aluminum, copper, molybdenum and gold.

In order to realize the isolation structure 110, in a same etching process, the etching rate of the material of the isolation structure should be less than that of the material of the conductive column. Therefore, in the present disclosure, the material of the isolation structure 110 are not limited to indium tin oxide or indium zinc oxide, and the material of the conductive column 107 are not limited to aluminum, copper, molybdenum, or gold.

Optionally, in some embodiments, a material of the insulating layer 111 is resin.

The groove 112 can be etched in the resin layer 111 using a mask and a lithography process. Those skilled in the art can understand that other organic insulating materials or inorganic insulating materials may also be used to form the insulating layer 111.

Optionally, in some embodiments, a material of the conductive layer 106 comprises one of indium tin oxide (ITO) and indium zinc oxide (IZO); a material of the second electrode 109 comprises one of indium tin oxide and indium zinc oxide.

In the embodiments of the present disclosure, the first electrode 105 may be a reflective anode of the OLED device 102, and the second electrode 109 may be a transparent cathode of the OLED device 102. Therefore, the OLED device 102 may be a top emitting OLED device. The reflective anode may comprise a laminated structure of a conductive layer of metal oxides (indium tin oxide or indium zinc oxide) and a metal layer, such as a laminated structure of an indium tin oxide layer/a metal layer, a laminated structure of indium tin oxide layer/a metal layer/an indium tin oxide layer, and the like.

Figure 6:
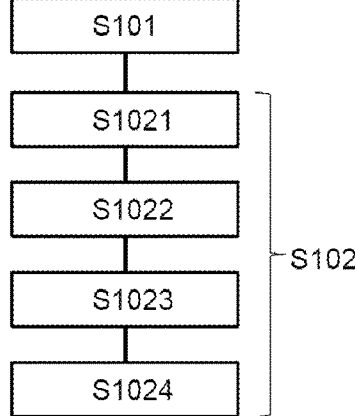
FIG. 6 is a flowchart of a manufacturing method of an OLED display panel according to an embodiment of the present disclosure.
Figure 7A:
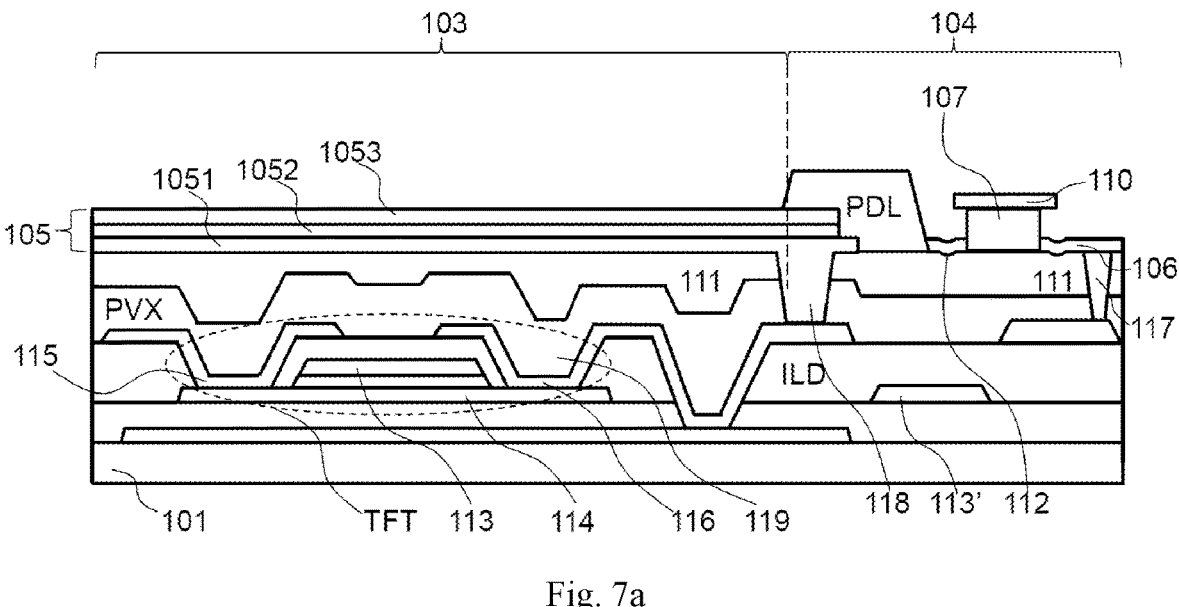
FIGS. 7a to 7c show schematic diagrams of the structures in the manufacturing process according to the manufacturing method shown in FIG. 6.
Figure 7B:
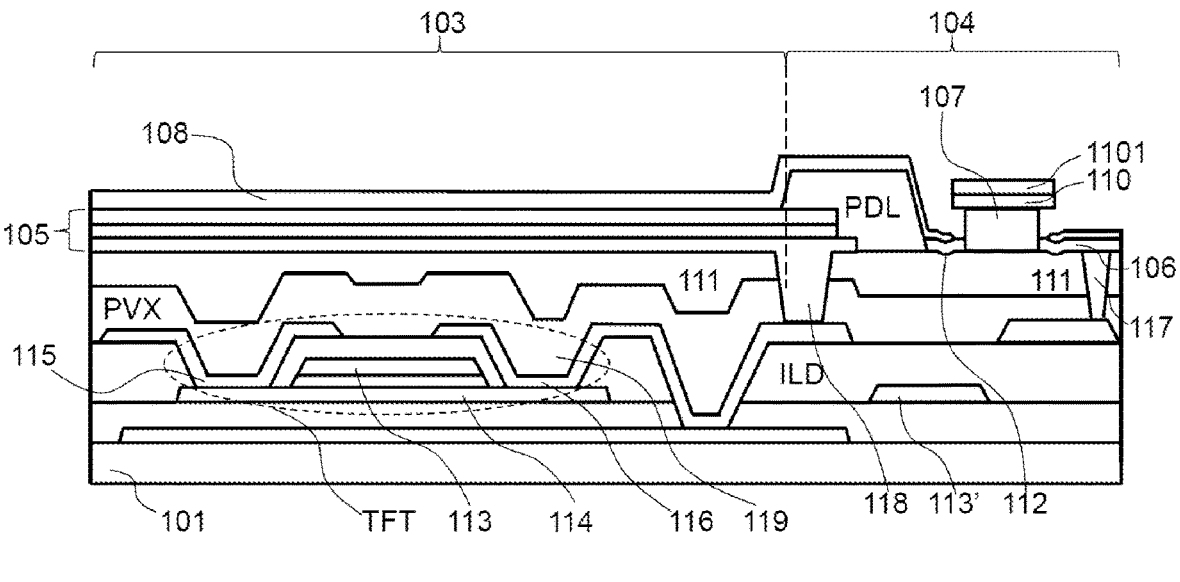
Figure 7C:
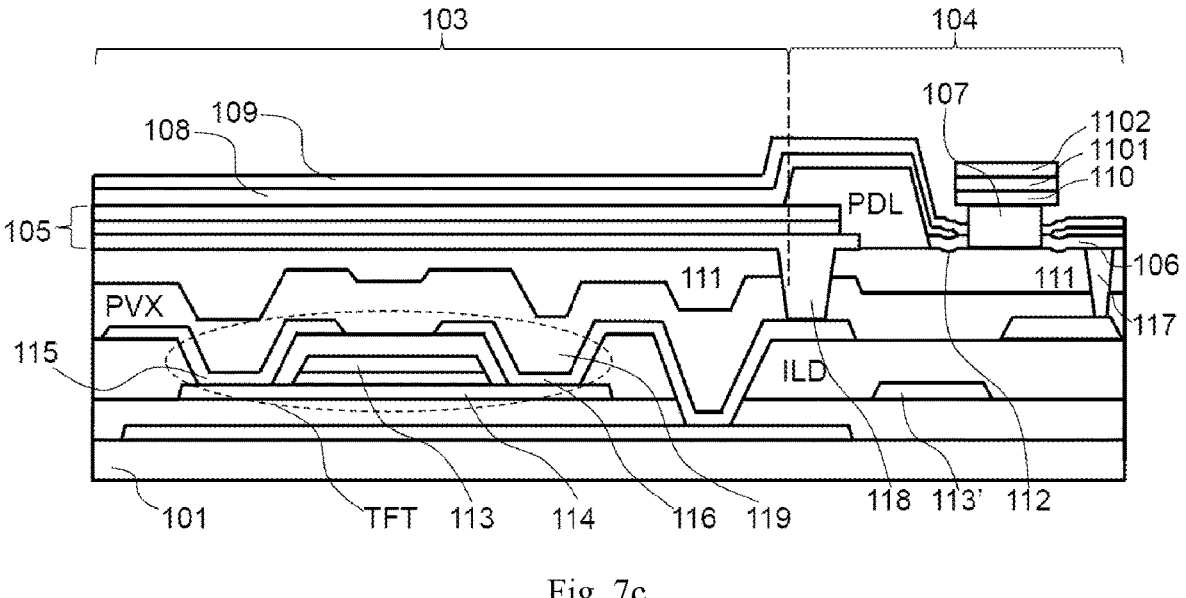

In some embodiments, the conductive layer 106 may be prepared simultaneously with the first electrode 105. For example, the first electrode 105 may comprise a laminated structure of a bottom indium tin oxide layer/a metal layer/a top indium tin oxide layer. FIG. 6 is a flowchart of a manufacturing method of an OLED display panel according to an embodiment of the present disclosure; FIGS. 7a to 7c show schematic diagrams of the structures in the manufacturing process according to the manufacturing method shown in FIG. 6. A same etching process may be used to form the bottom indium tin oxide layer (1051 as shown in FIG. 7a) of the first electrode 105 and the conductive layer 106; then, in another etching process, a metal layer (1052 as shown in FIG. 7a) of the first electrode 105 and the conductive column 107 are formed simultaneously; in another subsequent etching process, the top indium tin oxide layer (1053 as shown in FIG. 7a) of the first electrode 105 and the isolation structure 110 (as shown in FIG. 7a) are formed simultaneously. In the above embodiment, the bottom indium tin oxide layer of the first electrode 105 and the conductive layer 106 are made of the same material (e.g., indium tin oxide); the metal layer of the first electrode 105 and the conductive column 107 are made of the same material (e.g., aluminum or copper); the top indium tin oxide layer of the first electrode 105 and the isolation structure 110 are made of the same material (e.g., indium tin oxide).

As shown in FIG. 7b, by arranging a groove 112 on the surface of the insulating layer 111 away from the base substrate 101, the conductive layer 106 will also form a concave structure corresponding to the groove 112, and the shape of the concave structure matches the shape of the groove 112. When the organic light-emitting layer 108 is formed (e.g., by the evaporation process), the material of the organic light-emitting layer 108 will diffuse into the concave structure of the conductive layer 106.

As shown in FIG. 7c, when forming the second electrode 109, a connection between the second electrode 109 and the auxiliary electrode is formed.

Optionally, in some embodiments, as shown in FIG. 2, the conductive layer 106 comprises a through hole, and a part of the conductive column 107 fills the through hole. When the thickness of the conductive layer 106 is relatively large, such arrangement increases the contact area between the conductive column 107 and the conductive layer 106, thereby reducing the impedance of the auxiliary electrode.

Optionally, in some embodiments, as shown in FIG. 3, the bottom surface of the conductive column 107 is in direct contact with the top surface of the conductive layer 106.

In the embodiment shown in FIG. 3, the bottom surface of the conductive column 107 is in direct contact with the top surface of the conductive layer 106. When the thickness of the conductive layer 106 is relatively small, such an arrangement increases the contact area between the conductive column 107 and the conductive layer 106, thereby reducing the impedance of the auxiliary electrode.

Figure 5:
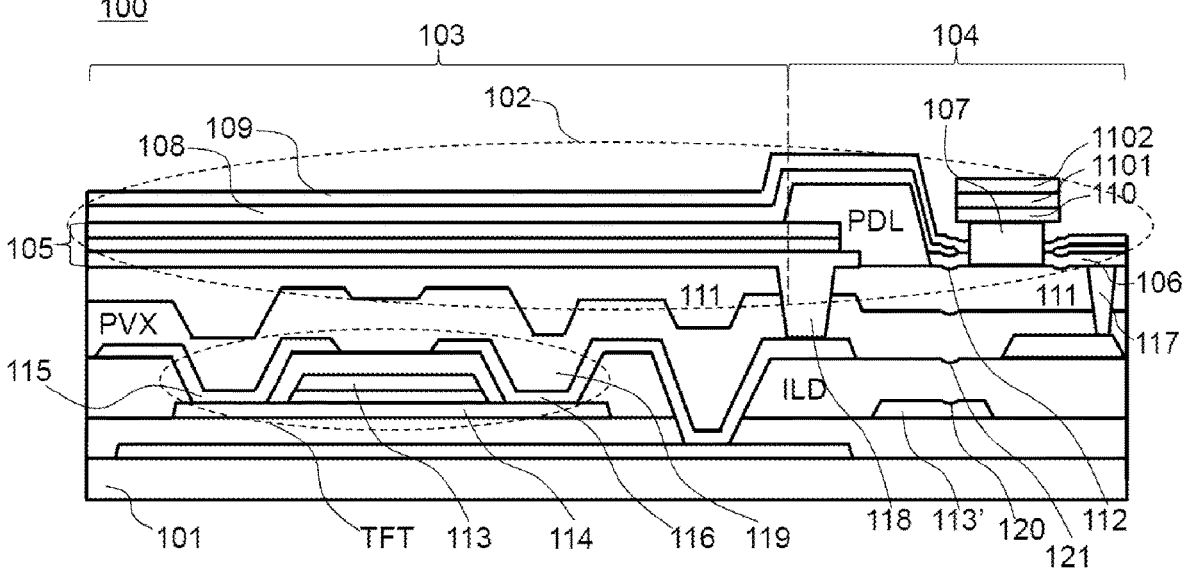
FIG. 5 is a schematic diagram of an OLED display panel according to another embodiment of the present disclosure.

Optionally, in some embodiments, as shown in FIGS. 1 and 5, the first electrode 105 is connected to the thin film transistor TFT through the via hole 118 in the insulating layer 111, and a width of the groove 112 is less than a width of the via hole 118 in the insulating layer 111.

In the embodiments of the present disclosure, the first electrode 105 is connected to the thin film transistor TFT by a via hole 118 in the insulating layer 111. Those skilled in the art can understand that the via hole 118 and the groove 112 can be formed in the insulating layer 111 in the same etching process, thereby simplifying the manufacturing process of the OLED display panel.

Optionally, in some embodiments, as shown in FIGS. 1 and 5, a slope angle of the groove 112 is less than a slope angle of the via hole 118 in the insulating layer 111.

In the context of the present disclosure, "slope angle" refers to the included angle between the side wall of the groove and its top surface, or the included angle between the side wall of the via hole and its bottom surface, or the included angle between the edge of the layer and the bottom surface of the layer.

Optionally, in some embodiments, as shown in FIGS. 1 and 5, the OLED display panel 100 further comprises: a pixel definition layer PDL; an edge of the pixel definition layer PDL extends to the groove 112.

Optionally, in some embodiments, as shown in FIGS. 1 and 5, the slope angle of the groove 112 is less than the slope angle of the edge of the pixel definition layer PDL.

In the embodiment of the present disclosure, the edge of the pixel definition layer PDL extends to the groove 112. With the slope of the edge of the pixel definition layer PDL and the groove 112, when the conductive layer 106 and the second electrode 109 are formed, the material of the second electrode 109 can be filled to the side surface of the conductive column 107 and the top surface of the conductive layer 106 through the concave structure of the conductive layer 106, thereby enhancing the electrical connection between the second electrode 109 and the auxiliary electrode.

Optionally, in some embodiments, as shown in FIGS. 1 and 5, a bottom vertex of the groove 112 and the isolation structure 110 do not overlap in the direction perpendicular to the base substrate 101.

In the embodiments of the present disclosure, the bottom vertex of the groove 112 and the isolation structure 110 do not overlap in the direction perpendicular to the base substrate 101. That is, a small part of the groove 112 overlaps with the isolation structure 110 in a direction perpendicular to the substrate 101. With this structure, the conductive layer 106, the organic light-emitting layer 108 and the second electrode 109 can form a desired slope at the position of the groove 112, so that the material of the second electrode 109 can be filled to the side surface of the conductive column 107 and the top surface of the conductive layer 106.

Optionally, in some embodiments, as shown in FIG. 5, the OLED display panel 100 further comprises: a gate layer 113' and a source drain layer 115, 116; at least one of the gate layer 113' and the source drain layers 115, 116 has a concave structure 120 at a position corresponding to the groove 112.

In some embodiments, at least one of the gate layer 113' and the source drain layers 115, 116 has a concave structure 120 at a position corresponding to the groove 112. Therefore, when subsequently forming the interlayer dielectric layer ILD, passivation layer PVX, and insulation layer 111, the groove 112 can be formed using the principle of morphology inheritance (as shown in FIG. 6), thereby simplifying the process steps.

Optionally, in some embodiments, as shown in FIG. 5, the OLED display panel further comprises an inter layer dielectric layer ILD; the interlayer dielectric layer ILD is provided with a concave structure 121 at the position corresponding to the groove 112.

In some embodiments, the interlayer dielectric layer ILD is provided with a concave structure 121 at the position corresponding to the groove 112. Therefore, when subsequently forming the passivation layer PVX and insulation layer 111, the groove 112 can be formed using the principle of morphology inheritance (as shown in FIG. 5), thus simplifying the process steps. In addition, with the above structure, the concave structure 121 and the via hole 119 in the interlayer dielectric layer ILD may also be formed in the same etching process.

Optionally, in some embodiments, as shown in FIG. 5, the source 115 and drain 116 of the thin film transistor TFT are connected with the active layer 114 of the thin film transistor TFT through a via hole 119 in the interlayer dielectric layer ILD. A size of the via hole 119 in the interlayer dielectric layer ILD is larger than that of the via hole 118 in the insulating layer 111.

In the subsequent manufacturing process, the planarization layer PVX will be applied on the interlayer dielectric layer ILD. With the above structure, a groove on the planarization layer PVX can be easily formed (as shown in FIG. 5).

According to another aspect of the present disclosure, a manufacturing method of an OLED display panel is provided. FIG. 6 is a flowchart of a manufacturing method of an OLED display panel according to an embodiment of the present disclosure; FIGS. 7*a* to 7*c* show schematic diagrams of the structures in the manufacturing process according to the manufacturing method shown in FIG. 6. The method comprises the following steps: S101: providing a base substrate 101, and S102: arranging an OLED device 102 on the base substrate 101, the OLED device 102 comprising a light-emitting region 103 and a non-light-emitting region 104. The step of arranging the OLED device 102 on the base substrate 101 (S102) comprises: S1021: forming a first electrode 105 in the light-emitting region 103 (as shown in FIG. 7*a*); S1022: forming an auxiliary electrode in the non-light-emitting region 104, the auxiliary electrode comprising a conductive layer 106 and a conductive column 107 on a side of the conductive layer 106 away from the base substrate 101, an orthographic projection of the conductive column 107 on the base substrate 101 being within an orthographic projection of the conductive layer 106 on the base substrate 101 (as shown in FIG. 7*a*); S1023: forming an organic light-emitting layer 108 (as shown in FIG. 7*b*) on a side of the first electrode 105 away from the base substrate 101 by an evaporation process; and S1024: forming a second electrode 109 on a side of the organic light-emitting layer 108 away from the base substrate 101 by a sputtering process, the second electrode 109 contacting a part of a top surface of the conductive layer 106 and a part of a side surface of the conductive column 107 (as shown in FIG. 7*c*).

In the embodiment of the present disclosure, since the orthographic projection of the conductive column 107 on the base substrate 101 is within the orthographic projection of the isolation structure 110 on the base substrate 101, when the organic light-emitting layer 108 is formed by using, for example, an evaporation process, the organic light-emitting material will be disconnected at the position of the isolation structure 110. With the isolation structure 110, the part of the organic light-emitting layer 108 of the OLED device 102 extending to the non-light-emitting region 104 can be effectively "cut off", thereby avoiding the transverse leakage current of the organic light-emitting layer 108 at this position. By arranging a groove 112 on the surface of the insulating layer 111 away from to the base substrate 101, the conductive layer 106 will also form a concave structure corresponding to the groove 112, and the shape of the concave structure matches the shape of the groove 112. When the organic light-emitting layer 108 is formed (e.g., by the evaporation process), the material of the organic light-emitting layer (i.e., the organic light-emitting material) will diffuse into the concave structure of the conductive layer 106. Therefore, when the second electrode 109 is formed (e.g., by the sputtering process), a material of the second electrode 109 can be filled to a side surface of the conductive column 107 and the top surface of the conductive layer 106 through the concave structure of the conductive layer 106, thereby enhancing the electrical connection between the second electrode 109 and the auxiliary electrode, and eliminating the uneven brightness of the display device.

Those skilled in the art can understand that an array composed of multiple OLED devices can be arranged on the OLED display panel, and multiple OLED devices can have the same structure.

In the description of the disclosure, the terms such as "on" and "below" indicate the orientation or positional relationship based on the orientation or positional relationship shown in the drawings, which is only for the convenience of describing the disclosure rather than requiring the disclosure to be constructed and operated in a specific orientation, so it cannot be understood as a limitation of the disclosure.

In the description of the present specification, the description referring to the terms "an embodiment", "some embodiments", "an example", "a specific example", or "some examples" or the like means a specific feature, structures, materials, or characteristics described in conjunction with the embodiment or example are included in at least one embodiment or example of the present disclosure. In this specification, the schematic expression of the above terms does not necessarily have to refer to the same embodiment or example. Furthermore, the specific features, structures, materials, or characteristics described can be combined in any suitable manner in any one or more of the embodiments or examples. In addition, those skilled in the art can combine the different embodiments or examples described in this specification and features of different embodiments or examples without conflicting with each other. In addition, it should be noted that the terms "first" and "second" are used for descriptive purposes only, and are not to be construed as indicating or implying relative importance or implicitly indicating the number of indicated technical features.

The above embodiments are only used for explanations rather than limitations to the present disclosure, the ordinary skilled person in the related technical field, in the case of not departing from the spirit and scope of the present disclosure, may also make various modifications and variations, therefore, all the equivalent solutions also belong to the scope of the present disclosure, the patent protection scope of the present disclosure should be defined by the claims.

What is claimed is:

1. An OLED display panel, comprising:
   a base substrate and an OLED device on the base substrate, wherein the OLED device comprises a light-emitting region and a non-light-emitting region,
   wherein the OLED device further comprises:
   a first electrode in the light-emitting region;
   an auxiliary electrode in the non-light-emitting region, wherein the auxiliary electrode comprises a conductive layer and a conductive column on a side of the conductive layer away from the base substrate, and wherein an orthographic projection of the conductive column on the base substrate is within an orthographic projection of the conductive layer on the base substrate;
   an organic light-emitting layer on a side of the first electrode away from the base substrate;
   a second electrode on a side of the organic light-emitting layer away from the base substrate;
   an isolation structure on a side of the conductive column away from the base substrate, wherein the orthographic projection of the conductive column on the base substrate is within an orthographic projection of the isolation structure on the base substrate; and
   an insulating layer between the conductive layer and the base substrate, and wherein a groove is arranged on a surface of the insulating layer away from the base substrate, and an orthographic projection of the groove on the base substrate at least partially overlaps with the orthographic projection of the isolation structure on the base substrate, wherein the OLED device further comprises:

a gate layer; and a source drain layer, wherein the gate layer has a concave structure at a position corresponding to the groove.

2. The OLED display panel as claimed in claim 1, wherein the second electrode contacts a part of a top surface of the conductive layer and a part of a side surface of the conductive column.

3. The OLED display panel as claimed in claim 1, wherein a distance of the orthographic projection of the isolation structure on the base substrate extends beyond the orthographic projection of the conductive column on the base substrate is a, a distance between an orthographic projection of an edge of the groove on the base substrate and the orthographic projection of the conductive column on the base substrate is z, and z is less than a.

4. The OLED display panel as claimed in claim 1, wherein a depth of the groove is greater than a thickness of the organic light-emitting layer.

5. The OLED display panel as claimed in claim 3, wherein a shape of the groove is a spherical crown, and a diameter of the groove is greater than a.

6. The OLED display panel as claimed in claim 5, wherein the diameter of the groove is greater than z.

7. The OLED display panel as claimed in claim 1, wherein a shape of the groove is selected from any one of a cuboid, a spherical crown, or a connected shape of at least two spherical crowns.

8. The OLED display panel as claimed in claim 1, wherein a bottom surface of the isolation structure is in direct contact with a top surface of the conductive column, a material of the isolation structure comprises one of indium tin oxide and indium zinc oxide, and a material of the conductive column comprises at least one of aluminum, copper, molybdenum or gold.

9. The OLED display panel as claimed in claim 1, wherein a material of the insulating layer is resin.

10. The OLED display panel as claimed in claim 1, wherein a material of the conductive layer comprises one of indium tin oxide or indium zinc oxide, and a material of the second electrode comprises one of indium tin oxide or indium zinc oxide.

11. The OLED display panel as claimed in claim 1, wherein the conductive layer comprises a through hole, and a part of the conductive column fills the through hole.

12. The OLED display panel as claimed in claim 1, wherein a bottom surface of the conductive column is in direct contact with a top surface of the conductive layer.

13. The OLED display panel as claimed in claim 1, wherein the first electrode is connected to a thin film transistor through a via hole in the insulating layer, and a width of the groove is less than a width of the via hole in the insulating layer.

14. The OLED display panel as claimed in claim 13, wherein a slope angle of the groove is less than a slope angle of the via hole in the insulating layer.

15. The OLED display panel as claimed in claim 1, further comprising:

a pixel definition layer, wherein an edge of the pixel definition layer extends to the groove.

16. The OLED display panel as claimed in claim 15, wherein a slope angle of the groove is less than a slope angle of the edge of the pixel definition layer.

17. The OLED display panel as claimed in claim 1, wherein a bottom vertex of the groove and the isolation structure do not overlap in a direction perpendicular to the base substrate.

18. An OLED display panel, comprising:

a base substrate;

an OLED device on the base substrate; and an interlayer dielectric layer, wherein the OLED device comprises a light-emitting region and a non-light-emitting region, wherein the OLED device further comprises:

a first electrode in the light-emitting region;

an auxiliary electrode in the non-light-emitting region, wherein the auxiliary electrode comprises a conductive layer and a conductive column on a side of the conductive layer away from the base substrate, and wherein an orthographic projection of the conductive column on the base substrate is within an orthographic projection of the conductive layer on the base substrate;

an organic light-emitting layer on a side of the first electrode away from the base substrate;

a second electrode on a side of the organic light-emitting layer away from the base substrate;

an isolation structure on a side of the conductive column away from the base substrate, wherein the orthographic projection of the conductive column on the base substrate is within an orthographic projection of the isolation structure on the base substrate; and an insulating layer between the conductive layer and the base substrate, and wherein a groove is arranged on a surface of the insulating layer away from the base substrate, and an orthographic projection of the groove on the base substrate at least partially overlaps with the orthographic projection of the isolation structure on the base substrate, and wherein the interlayer dielectric layer is provided with a concave structure matching a shape of the groove at a position corresponding to the groove.

19. The OLED display panel as claimed in claim 18, wherein a source electrode and a drain electrode of a thin film transistor are connected with an active layer of the thin film transistor through a via hole in the interlayer dielectric layer, and a size of the via hole in the interlayer dielectric layer is larger than a size of the via hole in the insulating layer.

* * * * *